(12) United States Patent
Qian et al.

(10) Patent No.: US 10,270,067 B2
(45) Date of Patent: Apr. 23, 2019

(54) AMOLED DISPLAY PANEL MANUFACTURING METHOD, APPARATUS AND SYSTEM

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Guoping Qian, Beijing (CN); Yangkun Jing, Beijing (CN); Chengye Wu, Beijing (CN); Bei Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 28 days.

(21) Appl. No.: 15/321,550

(22) PCT Filed: Mar. 4, 2016

(86) PCT No.: PCT/CN2016/075586
§ 371 (c)(1),
(2) Date: Dec. 22, 2016

(87) PCT Pub. No.: WO2016/145998
PCT Pub. Date: Sep. 22, 2016

(65) Prior Publication Data
US 2017/0214005 A1    Jul. 27, 2017

(30) Foreign Application Priority Data
Mar. 16, 2015   (CN) .......................... 2015 1 0113975

(51) Int. Cl.
*H01L 51/56* (2006.01)
*H01L 27/32* (2006.01)
(Continued)

(52) U.S. Cl.
CPC ............ *H01L 51/56* (2013.01); *G06T 7/0004* (2013.01); *G06T 7/62* (2017.01); *H01L 21/77* (2013.01);
(Continued)

(58) Field of Classification Search
CPC .............. H01L 21/02104; H01L 51/56; H01L 51/0011; H01L 51/0003; C23C 14/042; C23C 14/12; C23C 14/228; B05D 1/60
See application file for complete search history.

(56) References Cited

U.S. PATENT DOCUMENTS

2013/0071959 A1* 3/2013 Forrest ................ H01L 51/0004
438/22
2013/0169979 A1* 7/2013 Abe ........................ B41F 15/26
358/1.5
(Continued)

FOREIGN PATENT DOCUMENTS

CN          1392594 A     1/2003
CN        102222644 A    10/2011
(Continued)

OTHER PUBLICATIONS

International Search Report with English Language Translation, dated Jun. 13, 2016, PCT Application No. PCT/CN2016/075586.
(Continued)

*Primary Examiner* — Brian Turner
(74) *Attorney, Agent, or Firm* — Womble Bond Dickinson (US) LLP (57) ABSTRACT

The present disclosure discloses an AMOLED display panel manufacturing method, apparatus and system. The method
(Continued)

comprises: collecting size parameters of a substrate, constructing an AMOLED display panel model based on the size parameters, and determining spray data of respective organic vapor materials; controlling corresponding spraying devices to spray the respective organic vapor materials on the substrate successively according to the determined spray data of the respective organic vapor materials, to form an AMOLED display panel.

20 Claims, 4 Drawing Sheets

(51) Int. Cl.
*H05B 33/22* (2006.01)
*H01L 51/48* (2006.01)
*H01L 21/77* (2017.01)
*G06T 7/62* (2017.01)
*G06T 7/00* (2017.01)
*H01L 51/00* (2006.01)

(52) U.S. Cl.
CPC .......... *H01L 27/32* (2013.01); *H01L 27/3244* (2013.01); *H01L 51/0011* (2013.01); *G06T 2207/30148* (2013.01); *H01L 2227/323* (2013.01)

(56) References Cited

U.S. PATENT DOCUMENTS

| | | | |
|---|---|---|---|
| 2013/0337588 A1* | 12/2013 | Lee | ........................ C23C 14/042 438/22 |
| 2014/0065750 A1* | 3/2014 | Harikrishna Mohan | .................... H01L 51/5265 438/35 |
| 2014/0110701 A1 | 4/2014 | Noh | |
| 2014/0139410 A1* | 5/2014 | Peeters | ................. H01L 51/447 345/77 |

FOREIGN PATENT DOCUMENTS

| | | |
|---|---|---|
| CN | 103434135 A | 12/2013 |
| CN | 103496855 A | 1/2014 |
| CN | 104051599 A | 9/2014 |
| CN | 104409651 A | 3/2015 |
| CN | 104659071 A | 5/2015 |
| EP | 1271245 A2 | 1/2003 |

OTHER PUBLICATIONS

Office Action in Chinese Application No. 201510113975.X dated Jul. 19, 2017, with English translation.
Office Action in Chinese Application No. 201510113975.X dated Mar. 1, 2017, with English translation. 10 pages.

* cited by examiner

Fig. 1

121
collecting image information of the substrate using an image sensor of an electric coupling device

122
obtaining three-dimensional size parameters of the substrate based on the image information

Fig. 2

131
establishing an AMOLED display panel model based on the size parameters, acquiring material types, geometrical patterns and film layer thicknesses of respective film layers in the AMOLED display panel model

132
selecting suitable organic vapor materials according to the acquired material types of the respective film layers

133
setting suitable spray data for the selected organic vapor materials according to the acquired geometrical patterns and film layer thicknesses of the respective film layers

AMOLED DISPLAY PANEL MANUFACTURING METHOD, APPARATUS AND SYSTEM

RELATED APPLICATIONS

The present application is the U.S. national phase entry of PCT/CN2016/075586, with an international filing date of Mar. 4, 2016, which claims the benefit of Chinese Patent Application No. 201510113975.X, filed on Mar. 16, 2015, the entire disclosures of which are incorporated herein by reference.

FIELD

The present disclosure relates to the field of display panel manufacturing technology, and particularly to an AMOLED display panel manufacturing method, apparatus and system.

BACKGROUND

In the prior art, the active matrix organic light emitting diode (AMOLED) display panel has become one of the popular display panels currently, so its manufacturing method and yield have become a focus of attention in the industry.

As for an existing AMOLED display panel, the film layer manufacturing process thereof may be deposition or evaporation. However, the deposition or evaporation process requires masking of a mask to form a desired pattern, but the presence of the mask would cause deviations in the precision of the pattern formed by deposition, particularly for the manufacture of a small-sized panel. In addition, it would further result in the problem of poor uniformity in the film layers formed by deposition, and defects such as waste of material and low deposition rate.

SUMMARY

Embodiments of the present disclosure provide an AMOLED display panel manufacturing method, apparatus and system, which may solve the problems existing in the prior art such as poor uniformity in film layers, waste of material and low film formation rate which result from the AMOLED display panel manufacturing process.

In accordance with an aspect of the present disclosure, there is provided a method of manufacturing an AMOLED display panel. The method may comprise: providing a substrate; collecting size parameters of the substrate; constructing an AMOLED display panel model based on the size parameters, and determining spray data of respective organic vapor materials according to the constructed AMOLED display panel model, wherein the spray data includes a spray sequence, a spray pattern and a spray thickness; controlling corresponding spraying devices to spray the respective organic vapor materials on the substrate successively based on the spray sequence according to the determined spray data of the respective organic vapor materials, to form an AMOLED display panel.

Optionally, collecting size parameters of the substrate may specifically comprise: collecting image information of the substrate using an image sensor of an electric coupling device; obtaining three-dimensional size parameters of the substrate based on the image information.

Optionally, constructing an AMOLED display panel model based on the size parameters, and determining spray data of respective organic vapor materials according to the constructed AMOLED display panel model may specifically comprise: establishing an AMOLED display panel model based on the size parameters, acquiring material types, geometrical patterns and film layer thicknesses of respective film layers in the AMOLED display panel model; selecting suitable organic vapor materials according to the acquired material types of the respective film layers; and setting suitable spray data for the selected organic vapor materials according to the acquired geometrical patterns and film layer thicknesses of the respective film layers.

Optionally, controlling corresponding spraying devices to spray the respective organic vapor materials on the substrate successively based on the spray sequence according to the determined spray data of the respective organic vapor materials, to form an AMOLED display panel may specifically comprise: for each film layer to be formed, controlling a spraying device to spray the organic vapor material on the substrate to form a geometrical pattern profile of the film layer according to spray data of a respective organic vapor material; repeatedly spraying the organic vapor material on the formed geometrical pattern profile by controlling a relative movement between the spraying device and the substrate until a geometrical pattern of the current film layer thickness is formed; forming the AMOLED display panel after all the organic vapor materials are sprayed on the substrate successively based on the spray sequence.

Optionally, after a pattern of any film layer is formed by spraying, the method may further comprise: detecting whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

In accordance with another aspect of the present disclosure, there is provided an apparatus for manufacturing an AMOLED display panel, comprising: a provision unit for providing a substrate; a collection unit for collecting size parameters of the substrate; a modeling unit for constructing an AMOLED display panel model based on the size parameters collected by the collection unit, and for determining spray data of respective organic vapor materials according to the constructed AMOLED display panel model, wherein the spray data includes a spray sequence, a spray pattern and a spray thickness; a control unit for controlling a plurality of spraying devices to spray the respective organic vapor materials onto the substrate successively based on the spray data determined by the modeling unit to form an AMOLED display panel.

Optionally, the collection unit may specifically be configured to: collecting image information of the substrate using an image sensor of an electrical coupling device; obtaining three-dimensional size parameters of the substrate based on the image information.

Optionally, the modeling unit may specifically be configured to:

establishing an AMOLED display panel model based on the size parameters, acquiring material types, geometrical patterns and film layer thicknesses of respective film layers in the AMOLED display panel model; selecting suitable organic vapor materials according to the acquired material types of the respective film layers; and setting suitable spray data for the selected organic vapor materials according to the acquired geometrical patterns and film layer thicknesses of the respective film layers.

Optionally, the control unit may specifically be configured to: for each film layer to be formed, controlling a spraying device to spray the organic vapor material on the substrate to form a geometrical pattern profile of the film layer according to spray data of a respective organic vapor material; repeatedly spraying the organic vapor material on the geometrical pattern profile by controlling a relative movement between the spraying device and the substrate until a geometrical pattern of the current film layer thickness is formed; forming the AMOLED display panel after all the organic vapor materials are sprayed on the substrate successively based on the spray sequence.

Optionally, the apparatus may further comprise: a detection unit for detecting, after a pattern of any film layer is formed by spraying, whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

In accordance with a further aspect of the present disclosure, there is provided a system for manufacturing an AMOLED display panel, comprising: a spraying device; the apparatus for manufacturing an AMOLED display panel as described above which is coupled to the spraying device; and an organic vapor material chamber coupled to the apparatus for manufacturing an AMOLED display panel.

Optionally, in the system, the apparatus for manufacturing an AMOLED display panel may further comprise: a bearing panel for bearing a substrate to be handled.

Optionally, the system may further comprise: a curing device disposed beneath the bearing panel for cooling the organic vapor material sprayed onto the substrate.

In embodiments of the present disclosure, the assistance of a mask is not required, instead, automatic spraying is performed only dependent on the acquired spray data, which consequently guarantees the precision of the film layer manufacture while avoiding poor precision in the pattern, thickness, etc of the film layer resulting from the mask, and further avoids waste of the film layer materials due to the presence of the mask. In addition, in the solutions involved in the present disclosure, the sprayed organic vapor materials are controllable and the fineness of the spraying device is adjustable, thereby the efficiency of the film layer manufacture is improved. Furthermore, the prior art solutions form an AMOLED display panel by deposition or evaporation, which thus needs to dispose the substrate in a vacuum chamber and has extremely strict requirements on the environment. However, the present disclosure just needs to be carried out in a normal panel manufacturing environment, which thereby decreases the requirement on the manufacturing environment and the process of which is easy to carry out.

BRIEF DESCRIPTION OF DRAWINGS

To set forth the technical solutions in embodiments of the present disclosure more clearly, the drawings needed for describing the embodiments will be simply introduced below. Apparently, the drawings in the description below are only some embodiments of the present disclosure. Those ordinarily skilled in the art may further obtain other drawings based on said drawings without spending inventive efforts.

DETAILED DESCRIPTION

To make the objective, technical solutions and advantages of the present disclosure clearer, the present disclosure will be further described in detail with reference to the drawings. Apparently, the described embodiments are only part of the embodiments of the present disclosure rather than all of them. All other embodiments obtained by those ordinarily skilled in the art on the basis of the embodiments in the present disclosure without spending inventive efforts fall within the protection scope of the present disclosure.

Embodiments of the present disclosure provide an AMOLED display panel manufacturing method and manufacturing apparatus. Different from the prior art solutions, the present disclosure provides a substrate, collects size parameters of the substrate, then constructs an active matrix organic light emitting diode AMOLED display panel model based on the collected size parameters, and further determines spray data of respective organic vapor materials to be sprayed according to the constructed AMOLED display panel model. In the present disclosure, the spray data includes but is not limited to a spray sequence, a spray pattern and a spray thickness. After determining the spray data of respective organic vapor materials to be sprayed, corresponding spraying devices are controlled to spray the respective organic vapor materials onto the substrate successively based on the spray sequence according to the spray data, finally forming an AMOLED display panel. During this manufacturing flow, the assistance of a mask is not required, instead, automatic spraying is performed only dependent on the acquired spray data, which guarantees the precision of the film layer manufacture while avoiding poor precision in the pattern, thickness, etc of the film layer resulting from the mask, and further avoids waste of the film layer material due to the presence of the mask. Furthermore, in the solutions involved in the present disclosure, the sprayed organic vapor materials are controllable and the fineness of the spraying device is adjustable, thereby the efficiency of the film layer manufacture is improved. In addition, the prior art solutions form an AMOLED display panel by deposition or evaporation, which needs to dispose the substrate in a vacuum chamber and has extremely strict requirements on the environment. However, the present disclosure just needs to be carried out in a normal panel manufacturing environment, which consequently decreases the requirement on the manufacturing environment and the process of which is easy to carry out.

The above solutions of the present disclosure are described below in detail by means of specific embodiments. The present disclosure includes but is not limited to the following embodiments.

Figure 1:
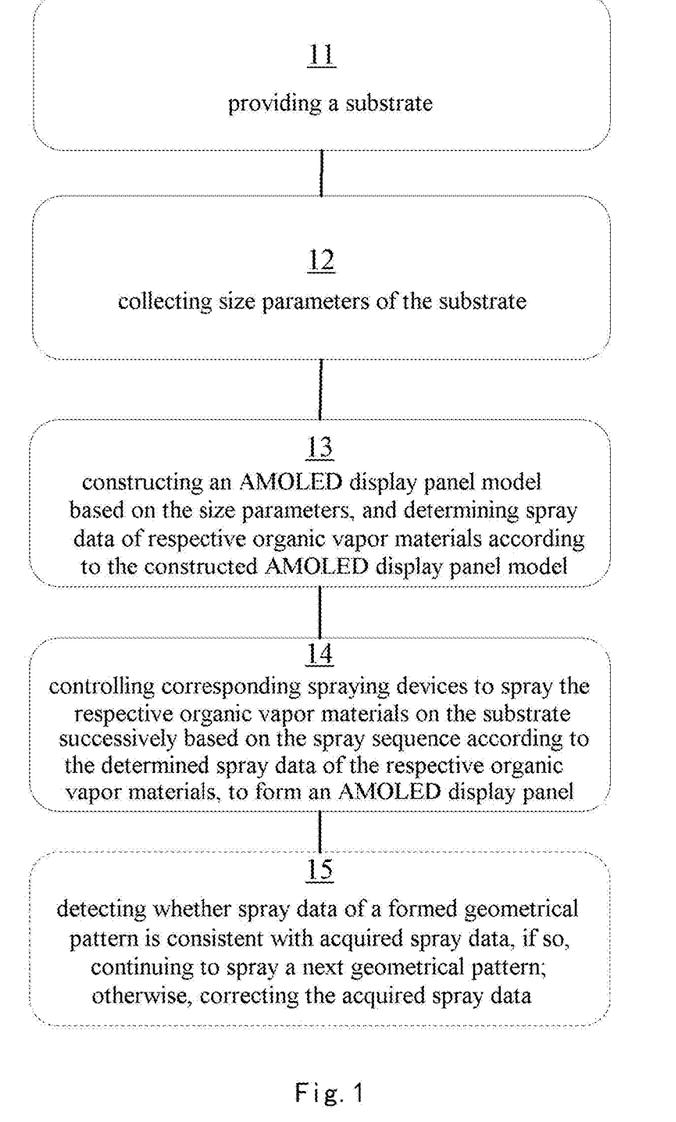
FIG. 1 is a flow schematic diagram of a method of manufacturing an AMOLED display panel provided by embodiments of the present disclosure.

As shown in FIG. 1, it is a flow schematic diagram of a method of manufacturing an AMOLED display panel provided by embodiments of the present disclosure. This method is applicable to an AMOLED display panel of any size and any specifications. In addition, it is also applicable to an array substrate and a color film substrate which do not have extra manufacturing requirements.

Specifically, this manufacturing method mainly comprises the following steps:

Step 11: providing a substrate.

In embodiments of the present disclosure, the substrate for manufacturing an AMOLED display panel may be a glass substrate, a metal substrate, a quartz substrate, an organic substrate, or the like in the prior art, which may further be various flexible substrates that can achieve the manufacture of an AMOLED display panel.

Step 12: collecting size parameters of the substrate.

Specifically, in embodiments of the present disclosure, it is required to collect size parameters of the substrate. This collection operation can be achieved in any manner for the only purpose of acquiring the size parameters of the substrate. Considering that the existing substrate is generally rectangular, the size parameters involved include length, width, height (also understood as the thickness of the substrate), length of the diagonal, etc. If the substrate is of other shapes, supposing that it has a round shape, the size parameters involved include radius or diameter, height and so on.

Figure 2:
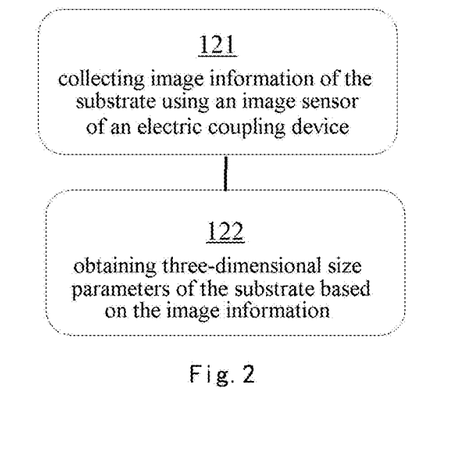
FIGS. 2-4 illustrate several steps in the method of manufacturing an AMOLED display panel as shown in FIG. 1 in more detail.

In the present disclosure, the substrates involved are generally rectangular. Thus, Step 12 may comprise (as shown in FIG. 2): collecting image information of the substrate using an image sensor of an electrical coupling device (sub-step 121), and obtaining three-dimensional size parameters of the substrate by analyzing the collected image information (sub-step 122). The three-dimensional size parameters can be understood as size parameters such as the length, width and height of the substrate.

Step 13: constructing an active matrix organic light emitting diode (AMOLED) display panel model based on the size parameters, and determining spray data of respective organic vapor materials according to the constructed AMOLED display panel model.

The spray data includes a spray sequence, a spray pattern and a spray thickness.

In embodiments of the present disclosure, the AMOLED display panel model is constructed based on the size parameters after acquiring the size parameters of the substrate. On the one hand, it is possible to collect graphic parameters of the AMOLED display panels formed by substrates of various size specifications according to actual manufacturing process experience, and to make them constitute a query list together with the substrates of corresponding sizes. After the size parameters of a substrate are acquired, it is possible to query from the query list graphic parameters of the AMOLED display panel that can be formed by the substrate with said size parameters, construct an AMOLED display panel model based on said graphic parameters, and then determine spray data of respective organic vapor materials according to the constructed AMOLED display panel model. On the other hand, after the size parameters of a substrate are acquired, it is possible to use model software directly to construct an AMOLED display panel model based on said size parameters, and then determine spray data of respective organic vapor materials according to the constructed AMOLED display panel model.

Figure 3:
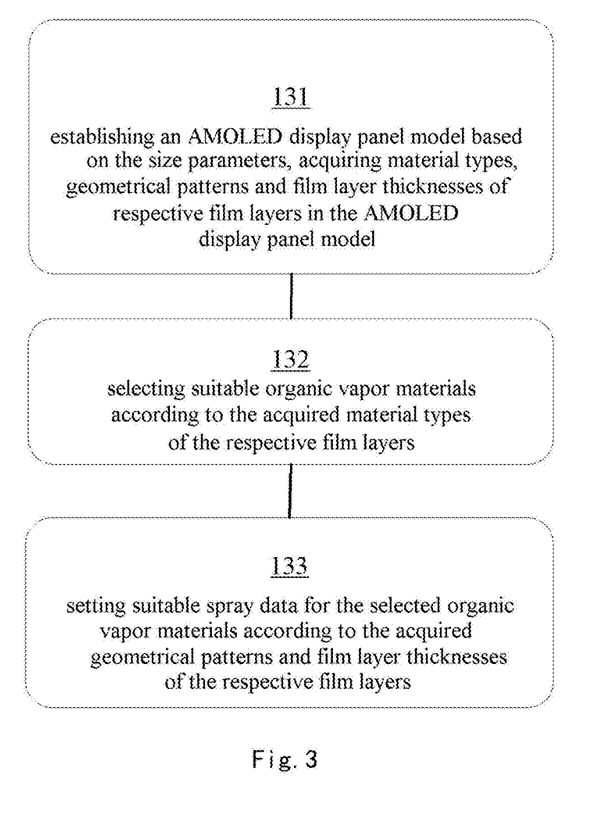

Optionally, Step 13 may comprise (as shown in FIG. 3): establishing an AMOLED display panel model based on said size parameters, and acquiring material types, geometrical patterns and film layer thicknesses of respective film layers in the AMOLED display panel model (sub-step 131); selecting suitable organic vapor materials according to the acquired material types of respective film layers (sub-step 132); and setting suitable spray data for the selected organic vapor materials according to the acquired geometrical patterns and film layer thicknesses of respective film layers (sub-step 133).

Step 14: controlling corresponding spraying devices to spray the respective organic vapor materials on the substrate successively based on the spray sequence in accordance with the determined spray data of the respective organic vapor materials, to form an AMOLED display panel.

Specifically, in embodiments of the present disclosure, after determining the spray data of the respective organic vapor materials, corresponding spraying devices can be controlled to perform the spraying operation successively on the substrate according to the spray sequence. For example, after determining that it is required to spray organic vapor materials a, b, c and d successively, spraying is first performed on the substrate according to the spray pattern and spray thickness to which the organic vapor material a corresponds to form a first organic film layer, and then spraying is performed on the substrate formed with the first organic film layer according to the spray pattern and spray thickness to which the organic vapor material b corresponds to form a second organic film layer. Likewise, a third film layer and a fourth film layer are formed using the organic vapor materials c and d successively. Finally, a required AMOLED display panel is formed.

It is to be noted that the above embodiments do not explain the details of manufacturing an AMOLED display panel and particularly do not specify the organic vapor materials. Since the film layers of the AMOLED display panel in the above solution have similar materials as those of the prior art AMOLED display panel, only the spraying procedure is described here, whereas unnecessary definitions are not made.

Figure 4:
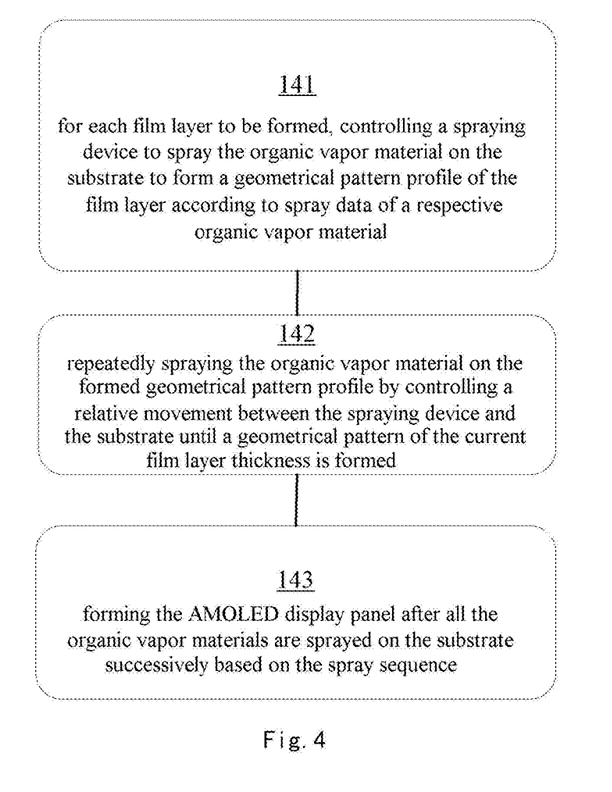

Optionally, Step 14 may comprise (as shown in FIG. 4): for each film layer to be formed, controlling a spraying device to spray the organic vapor material on the substrate to form a geometrical pattern profile of this film layer according to spray data of a respective organic vapor material (sub-step 141); repeatedly spraying the organic vapor material on the formed geometrical pattern profile by controlling a relative movement between the spraying device and the substrate, until a geometrical pattern of the current film layer thickness is formed (sub-step 142); forming the AMOLED display panel after spraying all the organic vapor materials on the substrate successively based on the spray sequence (sub-step 143).

In embodiments of the present disclosure, in order to ensure that the AMOLED display panel formed by spraying is an AMOLED display panel as expected, correction processing can be performed after each film layer is formed. This manufacturing method may optionally comprise Step 15: detecting whether the spray data of the formed geometrical pattern is consistent with the acquired spray data after the pattern of any film layer is formed by spraying, if so, continuing to spray a next geometrical pattern; otherwise, correcting the acquired spray data to ensure that the spray data of a geometrical pattern subsequently formed by spraying is consistent with the acquired spray data.

As for the above detection scheme, in general, a detection period can be set to make adjustment based on the data such as length, width and height of the geometrical pattern currently formed by spraying. If the height of the actually formed geometrical pattern is smaller than the height in the acquired spray data, the height in the acquired spray data can be increased so as to perform the spraying operation according to the increased spray data upon next spraying, which ensures that the AMOLED display panel formed by spraying is an AMOLED display panel as excepted.

On the basis of the same inventive concept as the method of manufacturing an AMOLED display panel provided above, embodiments of the present disclosure further provide an apparatus for manufacturing an AMOLED display panel.

Figure 5:
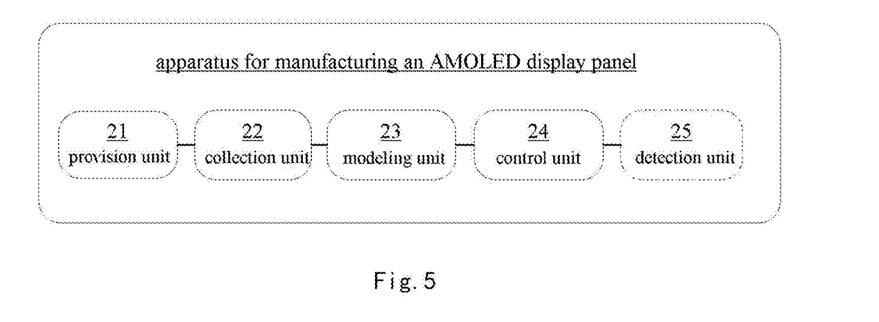
FIG. 5 is a structural schematic diagram of an apparatus for manufacturing an AMOLED display panel provided by embodiments of the present disclosure.

As shown in FIG. 5, it is a structural schematic diagram of an apparatus for manufacturing an AMOLED display panel provided by embodiments of the present disclosure. The apparatus comprises the following functional units: a provision unit 21 for providing a substrate; a collection unit 22 for collecting size parameters of the substrate.

The collection unit 22 is specifically configured to: collecting image information of the substrate using an image sensor of an electrical coupling device; obtaining three-dimensional size parameters based on the image information.

The apparatus further comprises a modeling unit 23 for constructing an AMOLED display panel model based on the size parameters collected by the collection unit, and determining spray data of respective organic vapor materials according to the constructed AMOLED display panel model, wherein the spray data includes spray sequence, spray pattern and spray thickness.

The modeling unit 23 is specifically used for: establishing an AMOLED display panel model based on the size parameters, acquiring material types, geometrical patterns and film layer thicknesses of respective film layers in the AMOLED display panel model; selecting suitable organic vapor materials according to the acquired material types of respective film layers; and setting suitable spray data for the selected organic vapor materials according to the acquired geometrical patterns and film layer thicknesses of respective film layers.

The apparatus further comprises a control unit 24 for controlling a plurality of spraying devices to spray respective organic vapor materials onto the substrate successively according to the spray data determined by the modeling unit 23 to form an AMOLED display panel.

The control unit 24 is specifically used for: for each film layer to be formed, controlling a spraying device to spray the organic vapor material on the substrate to form a geometrical pattern profile of the film layer according to spray data of a respective organic vapor material; repeatedly spraying the organic vapor material on the formed geometrical pattern profile by controlling a relative movement between the spraying device and the substrate, until a geometrical pattern of the current film layer thickness is formed; forming the AMOLED display panel after spraying all the organic vapor materials on the substrate successively based on the spray sequence.

The control unit 24 is capable of storing, receiving and processing various information.

Optionally, the apparatus further comprises a detection unit 25 for detecting, after the pattern of any film layer is formed by spraying, whether the spray data of the formed geometrical pattern is consistent with the acquired spray data, if so, continuing to spray a next geometrical pattern; otherwise, correcting the acquired spray data to ensure that the spray data of a geometrical pattern subsequently formed by spraying is consistent with the acquired spray data.

The AMOLED display panel manufacturing process flow of the present disclosure is described in detail below with reference to the apparatus for manufacturing an AMOLED display panel concerned by the present disclosure.

A manufacturing process flow utilizes a lot of apparatuses and devices and is rather complex. Therefore, during the AMOLED display panel manufacturing process flow, it is not only required to use the above AMOLED display panel manufacturing apparatus, but also required to use a spraying device, an organic vapor material chamber, a transmission device, etc for assistance.

Figure 6:
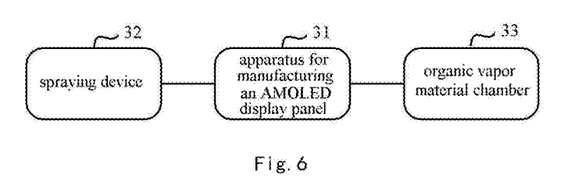
FIG. 6 is a structural schematic diagram of a system used in the AMOLED display panel manufacturing process flow stated in the present disclosure.

Specifically, as shown in FIG. 6, it is a structural schematic diagram of a system used in the AMOLED display panel manufacturing process flow stated in the present disclosure. The system comprises an AMOLED to display panel manufacturing apparatus 31, a plurality of spraying devices 32 and a plurality of organic vapor material chambers 33.

The AMOLED display panel manufacturing apparatus 31 may be, for example, the AMOLED display panel manufacturing apparatus as shown in FIG. 5 and may be further provided with a bearing panel for bearing the substrate to be handled. Moreover, the apparatus 31 can be disposed in a preset operating chamber. The operating chamber does not need to be a vacuum environment, as long as the cleanness required for a general panel manufacturing environment can be ensured. The apparatus 31 can bear the substrate to move in the chamber relative to the preceding spraying device 32 along a transmission device, i.e. moving from the preceding spraying device to the subsequent spraying device. Each spraying device 32 may be configured with at least one organic vapor material chamber 33. After the substrate moves to a position below any spraying device, the apparatus 31 can be inserted between the current spraying device 32 and the configured at least one organic vapor material chamber 33 so as to control the organic vapor material transported by the organic vapor material chamber to enter into the spraying device 32 below to perform the spraying operation.

Figure 7:
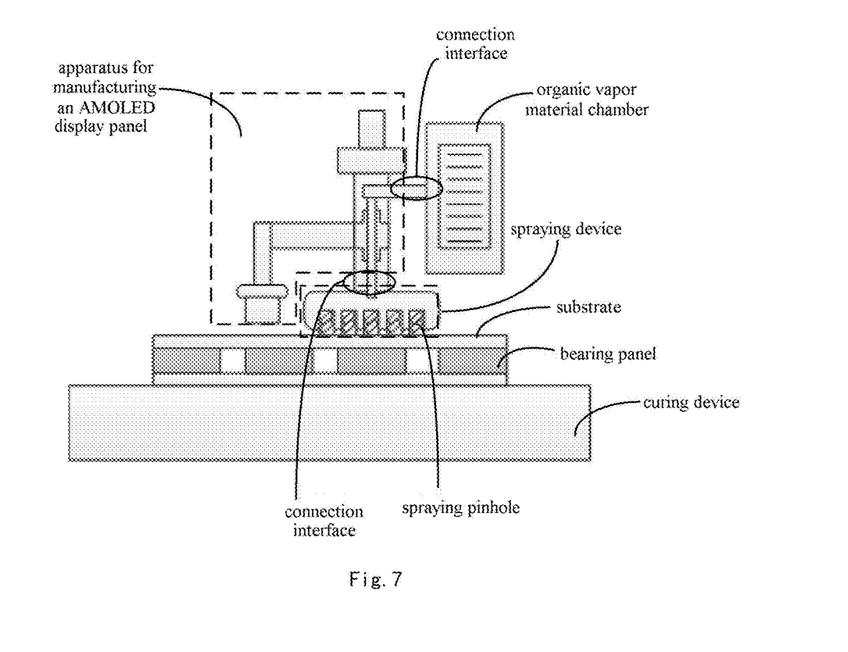
FIG. 7 is a structural schematic diagram of a system for manufacturing an AMOLED display panel provided by embodiments of the present disclosure.

In light of the structural schematic diagram of the system shown in FIG. 7, a connection interface is configured above the spraying device for connecting one side of the apparatus that comes over. Meanwhile, at least one organic vapor material chamber is configured above the spraying device. These organic vapor material chambers are also provided with a connection interface, respectively for connecting the other side of the apparatus that comes over. The spraying device is configured with a plurality of small spraying pinholes the size of which can be adjusted and changed according to the practical needs and the precision of spraying. The organic vapor material chamber is a temperature-controllable and heatable chamber, the heating temperature of which is generally the sum of the melting-point temperature of the organic vapor material and an adjusted temperature that can achieve vapor state. Generally speaking, one and the same spraying device can be configured with a plurality of organic vapor material chambers in the case that the organic vapor materials do not pollute each other.

Specifically, during the whole manufacturing process, supposing that a substrate is provided, size parameters of the substrate are acquired by a collection unit of the apparatus. A modeling unit constructs an AMOLED display panel model based on the size parameters and determines spray data of respective organic vapor materials according to the constructed AMOLED display panel model. Thus, the manufacturing apparatus acquires spray data of the organic vapor materials to be sprayed subsequently. Moreover, the substrate born by the manufacturing apparatus is moved to the first spraying device by controlling the speed of the transmission device. After it arrives, the manufacturing apparatus is connected to the spraying device and the organic vapor material chamber, respectively, and the vertical distance between the spraying device and the substrate is adjusted. Meanwhile, a pattern size to be formed by spraying is determined based on the acquired spray data, and the rate and time required for spraying are further calculated. Typically, it is possible to control the switching of respective spraying pinholes to determine the shape of the pattern, and control the carrier concentrations of the organic vapor materials before entering the spraying pinholes to determine the spraying rate. Then, the spraying pinholes can be controlled to repeatedly perform the spraying operation on the substrate. Specifically, the substrate is sprayed back and forth, and the movement of each time in one direction can spray a thickness of at least 0.5 µm. In fact, the thickness can be flexibly adjusted according to the spraying rate and spraying time as set. The above design of switching of the spraying pinholes enables the spraying pinholes to perform targeted spraying on the substrate. As compared with the prior art solution in which the film layers are formed using a mask, the solution of the present disclosure is more advantageous in saving materials.

After the first spraying device finishes the spraying operation, the apparatus can further detect the formed first organic film layer to examine whether the size of the formed first organic film layer is consistent with the acquired spray data. If so, the apparatus continues to move to the second spraying device (a next spraying device) to repeat the previous spraying operation. If not, it is required to adjust the previously acquired spray data accordingly such that the size of the film layer actually obtained is identical with the size of the film layer as expected, thereby ensuring that a required AMOLED display panel is formed.

It is to be noted that in the above embodiments the spraying operations of different spraying devices are enabled by moving the substrate. In fact, upon practical implementation, if conditions permit, it is also possible to fix the substrate and enable the spraying operations of different spraying devices by moving the spraying devices by means of a corresponding device.

Furthermore, since what is sprayed by the spraying pinhole is an organic vapor material, after it is sprayed on the substrate, to avoid the problem of poor uniformity in the formed film layers resulting from the instability of vapor, in embodiments of the present disclosure, a curing device for cooling the organic vapor material sprayed on the substrate can be arranged in the manufacturing apparatus below the bearing panel bearing the substrate. The curing device may specifically be a combination of a water cooling device and an air cooling fan device. The fan controls the low temperature in the water cooling device and constantly blows towards the substrate, thereby cooling the organic vapor material sprayed on the substrate in real time, and ensuring that the formed film layers have better uniformity.

Actually, in embodiments of the present disclosure, the respective apparatuses and devices are arranged in a flexible manner. The apparatus as well as the spraying devices and the organic vapor material chambers can be used as a novel 3D printing device.

By means of the embodiments of the above solution, using the manufacturing apparatus and the spraying devices, the organic vapor material chambers, etc provided by the present disclosure, size parameters of the substrate are collected, an active matrix organic light emitting diode AMOLED display panel model is constructed based on the size parameters, and spray data of respective organic vapor materials is determined according to the constructed AMOLED display panel model, wherein the spray data includes a spray sequence, a spray pattern and a spray thickness. Corresponding spraying devices are controlled to spray the respective organic vapor materials on the substrate successively based on the spray sequence according to the determined spray data of the respective organic vapor materials to form an AMOLED display panel. In this manner, the assistance of a mask is not required, instead, automatic spraying is performed only dependent on the acquired spray data, which guarantees the precision of the film layer manufacture while avoiding poor precision in the pattern, thickness, etc of the film layer resulting from the mask, and further avoids waste of the film layer material due to the presence of the mask. In addition, in the solutions involved in the present disclosure, the sprayed organic vapor materials are controllable and the precision of the spraying devices is adjustable, thereby the efficiency of the manufacture of film layers is improved. Furthermore, the prior art solutions form an AMOLED display panel by deposition or evaporation, which needs to dispose the substrate in a vacuum chamber and has extremely strict requirements on the environment. However, the present disclosure just needs to be carried out in a normal panel manufacturing environment, which thereby decreases the requirement on the manufacturing environment and the process of which is easy to carry out.

Although exemplary embodiments of the present disclosure are described, those skilled in the art can make other modifications and amendments to these embodiments once they learn the basic inventive concept. Therefore, the claims enclosed intend to be construed as including preferred embodiments and all modifications and amendments falling within the scope of the present disclosure.

Apparently, those skilled in the art can make various modifications and variations to the present disclosure without departing from the spirit and scope thereof. In this way, if these modifications and variations to the present disclosure fall within the scope of the claims of the present disclosure and equivalent technologies thereof, the present disclosure also intends to encompass these modifications and variations.

The invention claimed is:

1. A method of manufacturing an AMOLED display panel, comprising:
   providing a substrate;
   collecting size parameters of the substrate;
   constructing an AMOLED display panel model based on the size parameters, and determining spray data of respective organic vapor materials according to the constructed AMOLED display panel model, wherein the spray data includes a spray sequence, a spray pattern and a spray thickness;
   controlling corresponding spraying devices to spray the respective organic vapor materials on the substrate successively based on the spray sequence according to the determined spray data of the respective organic vapor materials, to form an AMOLED display panel without a mask.

2. The method according to claim 1, wherein collecting size parameters of the substrate comprises:
   collecting image information of the substrate using an image sensor of an electric coupling device;
   obtaining three-dimensional size parameters of the substrate based on the image information.

3. The method according to claim 2, after a pattern of any film layer is formed by spraying, further comprising:

detecting whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

4. The method according to claim 1, wherein constructing an AMOLED display panel model based on the size parameters, and determining spray data of respective organic vapor materials according to the constructed AMOLED display panel model comprise:
establishing an AMOLED display panel model based on the size parameters, acquiring material types, geometrical patterns and film layer thicknesses of respective film layers in the AMOLED display panel model;
selecting suitable organic vapor materials according to the acquired material types of the respective film layers; and,
setting suitable spray data for the selected organic vapor materials according to the acquired geometrical patterns and film layer thicknesses of the respective film layers.

5. The method according to claim 4, after a pattern of any film layer is formed by spraying, further comprising:
detecting whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

6. The method according to claim 1, wherein controlling corresponding spraying devices to spray the respective organic vapor materials on the substrate successively based on the spray sequence according to the determined spray data of the respective organic vapor materials, to form an AMOLED display panel comprises:
for each film layer to be formed, controlling a spraying device to spray the organic vapor material on the substrate to form a geometrical pattern profile of the film layer according to spray data of a respective organic vapor material;
repeatedly spraying the organic vapor material on the geometrical pattern profile by controlling a relative movement between the spraying device and the substrate until a geometrical pattern of the current film layer thickness is formed;
forming the AMOLED display panel after all the organic vapor materials are sprayed on the substrate successively based on the spray sequence.

7. The method according to claim 6, after a pattern of any film layer is formed by spraying, further comprising:
detecting whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

8. The method according to claim 1, after a pattern of any film layer is formed by spraying, further comprising:
detecting whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

9. An apparatus for manufacturing an AMOLED display panel, comprising:
a provision unit for providing a substrate;
a collection unit for collecting size parameters of the substrate;
a modeling unit for constructing an AMOLED display panel model based on the size parameters collected by the collection unit, and for determining spray data of respective organic vapor materials according to the constructed AMOLED display panel model, wherein the spray data includes a spray sequence, a spray pattern and a spray thickness;
a control unit for controlling a plurality of spraying devices to spray the respective organic vapor materials onto the substrate successively based on the spray data determined by the modeling unit to form an AMOLED display panel.

10. The apparatus according to claim 9, wherein the collection unit is configured to:
collecting image information of the substrate using an image sensor of an electrical coupling device;
obtaining three-dimensional size parameters of the substrate based on the image information.

11. The apparatus according to claim 9, wherein the modeling unit is configured to:
establishing an AMOLED display panel model based on the size parameters, acquiring material types, geometrical patterns and film layer thicknesses of respective film layers in the AMOLED display panel model;
selecting suitable organic vapor materials according to the acquired material types of the respective film layers; and,
setting suitable spray data for the selected organic vapor materials according to the acquired geometrical patterns and film layer thicknesses of the respective film layers.

12. The apparatus according to claim 9, wherein the control unit is configured to:
for each film layer to be formed, controlling a spraying device to spray the organic vapor material on the substrate to form a geometrical pattern profile of the film layer according to spray data of a respective organic vapor material;
repeatedly spraying the organic vapor material on the geometrical pattern profile by controlling a relative movement between the spraying device and the substrate until a geometrical pattern of the current film layer thickness is formed;
forming the AMOLED display panel after all the organic vapor materials are sprayed on the substrate successively based on the spray sequence.

13. The apparatus according to claim 9, further comprising:
a detection unit for detecting, after a pattern of any film layer is formed by spraying, whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

14. A system for manufacturing an AMOLED display panel, comprising:
a spraying device;

an apparatus for manufacturing an AMOLED display panel which is coupled to the spraying device; and an organic vapor material chamber coupled to the apparatus for manufacturing an AMOLED display panel, wherein the apparatus for manufacturing an AMOLED display panel comprises:

a provision unit for providing a substrate;

a collection unit for collecting size parameters of the substrate;

a modeling unit for constructing an AMOLED display panel model based on the size parameters collected by the collection unit, and for determining spray data of respective organic vapor materials according to the constructed AMOLED display panel model, wherein the spray data includes a spray sequence, a spray pattern and a spray thickness;

a control unit for controlling a plurality of spraying devices to spray the respective organic vapor materials onto the substrate successively based on the spray data determined by the modeling unit to form an AMOLED display panel.

15. The system according to claim 14, wherein the apparatus for manufacturing an AMOLED display panel further comprises:

a bearing panel for bearing a substrate to be handled.

16. The system according to claim 15, further comprising:

a curing device disposed beneath the bearing panel for cooling the organic vapor material sprayed onto the substrate.

17. The system according to claim 14, wherein the collection unit is configured to:

collecting image information of the substrate using an image sensor of an electrical coupling device;

obtaining three-dimensional size parameters of the substrate based on the image information.

18. The system according to claim 14, wherein the modeling unit is configured to:

establishing an AMOLED display panel model based on the size parameters, acquiring material types, geometrical patterns and film layer thicknesses of respective film layers in the AMOLED display panel model;

selecting suitable organic vapor materials according to the acquired material types of the respective film layers; and, setting suitable spray data for the selected organic vapor materials according to the acquired geometrical patterns and film layer thicknesses of the respective film layers.

19. The system according to claim 14, wherein the control unit is configured to:

for each film layer to be formed, controlling a spraying device to spray the organic vapor material on the substrate to form a geometrical pattern profile of the film layer according to spray data of a respective organic vapor material;

repeatedly spraying the organic vapor material on the geometrical pattern profile by controlling a relative movement between the spraying device and the substrate until a geometrical pattern of the current film layer thickness is formed;

forming the AMOLED display panel after all the organic vapor materials are sprayed on the substrate successively based on the spray sequence.

20. The system according to claim 14, wherein the apparatus for manufacturing an AMOLED display panel further comprising:

a detection unit for detecting, after a pattern of any film layer is formed by spraying, whether spray data of a formed geometrical pattern is consistent with acquired spray data, if so, continuing to spray a next geometrical pattern; otherwise, correcting the acquired spray data to ensure that spray data of a geometrical pattern subsequently formed by spraying is consistent with the acquired spray data.

* * * * *